US012046872B2

(12) United States Patent
Izumiya et al.

(10) Patent No.: US 12,046,872 B2
(45) Date of Patent: Jul. 23, 2024

(54) SURFACE EMITTING LASER, SURFACE EMITTING LASER DEVICE, LIGHT SOURCE DEVICE, AND DETECTION APPARATUS

(71) Applicants: Kazuma Izumiya, Miyagi (JP); Naoto Jikutani, Miyagi (JP); Kazuhiro Harasaka, Miyagi (JP); Ryoichiro Suzuki, Miyagi (JP)

(72) Inventors: Kazuma Izumiya, Miyagi (JP); Naoto Jikutani, Miyagi (JP); Kazuhiro Harasaka, Miyagi (JP); Ryoichiro Suzuki, Miyagi (JP)

(73) Assignee: RICOH COMPANY, LTD., Tokyo (JP)

( * ) Notice: Subject to any disclaimer, the term of this patent is extended or adjusted under 35 U.S.C. 154(b) by 800 days.

(21) Appl. No.: 17/100,951

(22) Filed: Nov. 23, 2020

(65) Prior Publication Data
US 2021/0167579 A1 Jun. 3, 2021

(30) Foreign Application Priority Data
Nov. 29, 2019 (JP) .................................. 2019-217393

(51) Int. Cl.
*H01S 5/183* (2006.01)
*G01S 7/481* (2006.01)
(Continued)

(52) U.S. Cl.
CPC ........ *H01S 5/18361* (2013.01); *H01S 5/0234* (2021.01); *H01S 5/18305* (2013.01);
(Continued)

(58) Field of Classification Search
None
See application file for complete search history.

(56) References Cited

U.S. PATENT DOCUMENTS 6,720,585 B1    4/2004   Wasserbauer et al.
7,372,886 B2 *  5/2008   Song ................... H01S 5/02461
                                                       372/99
(Continued)

FOREIGN PATENT DOCUMENTS

JP   H07-038196 A    2/1995
JP   2005-354061     12/2005
(Continued)

OTHER PUBLICATIONS

Office Action dated May 16, 2023 in Japanese Patent Application No. 2019-217393, 7 pages.
(Continued)

*Primary Examiner* — Eric L Bolda
(74) *Attorney, Agent, or Firm* — XSENSUS LLP

(57) ABSTRACT

A surface emitting laser includes a first reflecting mirror; a second reflecting mirror; an active region between the first reflecting mirror and the second reflecting mirror. The first reflecting mirror and the second reflecting mirror each include a plurality of low refractive-index layers having a first refractive index; and a plurality of high refractive-index layers having a second refractive index higher than the first refractive index. The plurality of low refractive-index layers and the plurality of high refractive-index layers are alternated one after another. The plurality of high refractive-index layers of the first reflecting mirror includes a first layer; and a second layer having a higher thermal diffusion property in an in-plane direction than the first layer.

20 Claims, 18 Drawing Sheets

(51) Int. Cl.
 *H01S 5/0234* (2021.01)
 *H01S 5/042* (2006.01)
(52) U.S. Cl.
 CPC ...... *H01S 5/18311* (2013.01); *H01S 5/18327* (2013.01); *G01S 7/4814* (2013.01); *H01S 5/04252* (2019.08); *H01S 2304/04* (2013.01)

(56) References Cited

U.S. PATENT DOCUMENTS

| | | |
|---|---|---|
| 2009/0285252 A1 | 11/2009 | Ishii et al. |
| 2009/0285602 A1 | 11/2009 | Harasaka et al. |
| 2009/0310632 A1 | 12/2009 | Sugawara et al. |
| 2011/0026555 A1 | 2/2011 | Takeuchi |
| 2011/0115872 A1 | 5/2011 | Harasaka et al. |
| 2011/0128343 A1 | 6/2011 | Sato et al. |
| 2011/0170155 A1 | 7/2011 | Jikutani et al. |
| 2011/0217077 A1 | 9/2011 | Harasaka et al. |
| 2011/0228035 A1 | 9/2011 | Ishii et al. |
| 2012/0057902 A1 | 3/2012 | Shouji et al. |
| 2012/0086765 A1 | 4/2012 | Higashi et al. |
| 2012/0121297 A1 | 5/2012 | Jikutani et al. |
| 2012/0294652 A1 | 11/2012 | Itoh et al. |
| 2013/0033559 A1 | 2/2013 | Sasaki et al. |
| 2013/0070039 A1 | 3/2013 | Harasaka et al. |
| 2013/0208067 A1 | 8/2013 | Izumiya et al. |
| 2013/0243022 A1 | 9/2013 | Harasaka et al. |
| 2014/0023104 A1 | 1/2014 | Suzuki et al. |
| 2014/0105647 A1 | 4/2014 | Harasaka et al. |
| 2014/0219683 A1 | 8/2014 | Harasaka et al. |
| 2014/0354366 A1 | 12/2014 | Suzuki et al. |
| 2014/0354367 A1 | 12/2014 | Suzuki et al. |
| 2015/0023381 A1 | 1/2015 | Ishii et al. |
| 2016/0094003 A1 | 3/2016 | Numata et al. |
| 2016/0094006 A1 | 3/2016 | Hagita et al. |
| 2016/0094009 A1 | 3/2016 | Izumiya et al. |
| 2016/0149375 A1 | 5/2016 | Ishii et al. |
| 2016/0276809 A1 | 9/2016 | Okura et al. |
| 2016/0329903 A1 | 11/2016 | Adachi et al. |
| 2017/0025820 A1 | 1/2017 | Suzuki et al. |
| 2017/0040771 A1 | 2/2017 | Suzuki |
| 2017/0168412 A1 | 6/2017 | Harada et al. |
| 2017/0302059 A1 | 10/2017 | Gerlach et al. |
| 2018/0034244 A1 | 2/2018 | Izumiya et al. |
| 2018/0347537 A1 | 12/2018 | Ikeoh et al. |
| 2021/0013703 A1 | 1/2021 | Numata et al. |

FOREIGN PATENT DOCUMENTS

| | | |
|---|---|---|
| JP | 2010-003873 A | 1/2010 |
| JP | 2011-035115 A | 2/2011 |
| JP | 2015-177000 | 10/2015 |
| JP | 2016-146417 A | 8/2016 |
| JP | 2017-532783 A | 11/2017 |
| JP | 2019-165198 A | 9/2019 |

OTHER PUBLICATIONS

Office Action dated Sep. 19, 2023 in Japanese Patent Application No. 2019-217393, 13 pages.

\* cited by examiner

SURFACE EMITTING LASER, SURFACE EMITTING LASER DEVICE, LIGHT SOURCE DEVICE, AND DETECTION APPARATUS

CROSS-REFERENCE TO RELATED APPLICATIONS

This patent application is based on and claims priority pursuant to 35 U.S.C. § 119(a) to Japanese Patent Application No. 2019-217393, filed on Nov. 29, 2019, in the Japan Patent Office, the entire disclosure of which is hereby incorporated by reference herein.

BACKGROUND

Technical Field

Embodiments of the present disclosure relate to a surface emitting laser, a surface emitting laser device, a light source device, and a detection apparatus.

Related Art

A vertical cavity surface emitting laser (VCSEL) is a semiconductor laser that oscillates a laser beam in a direction perpendicular to a substrate. The surface emitting laser has excellent characteristics capable of low-threshold current oscillation, single longitudinal mode oscillation, and arrangement in a two-dimensional array, unlike an edge-emission semiconductor laser that emits light in a direction parallel to a substrate.

SUMMARY

In one aspect of this disclosure, there is described a surface emitting laser including a first reflecting mirror; a second reflecting mirror; an active region between the first reflecting mirror and the second reflecting mirror. The first reflecting mirror and the second reflecting mirror each include a plurality of low refractive-index layers having a first refractive index; and a plurality of high refractive-index layers having a second refractive index higher than the first refractive index. The plurality of low refractive-index layers and the plurality of high refractive-index layers are alternated one after another. The plurality of high refractive-index layers of the first reflecting mirror includes a first layer; and a second layer having a higher thermal diffusion property in an in-plane direction than the first layer.

In another aspect of this disclosure, there is disclosed a surface emitting laser device including a mount substrate; and the surface emitting laser on the mount substrate.

In even another aspect of this disclosure, there is disclosed a light source device including the surface emitting laser device and a driver configured to drive the surface emitting laser device.

In still another aspect of this disclosure a detection apparatus including the light source device; and a photosensor configured to detect light emitted outside from the surface emitting laser and reflected by an object.

BRIEF DESCRIPTION OF THE SEVERAL VIEWS OF THE DRAWINGS

The aforementioned and other aspects, features, and advantages of the present disclosure would be better understood by reference to the following detailed description when considered in connection with the accompanying drawings, wherein.

Figure 1:
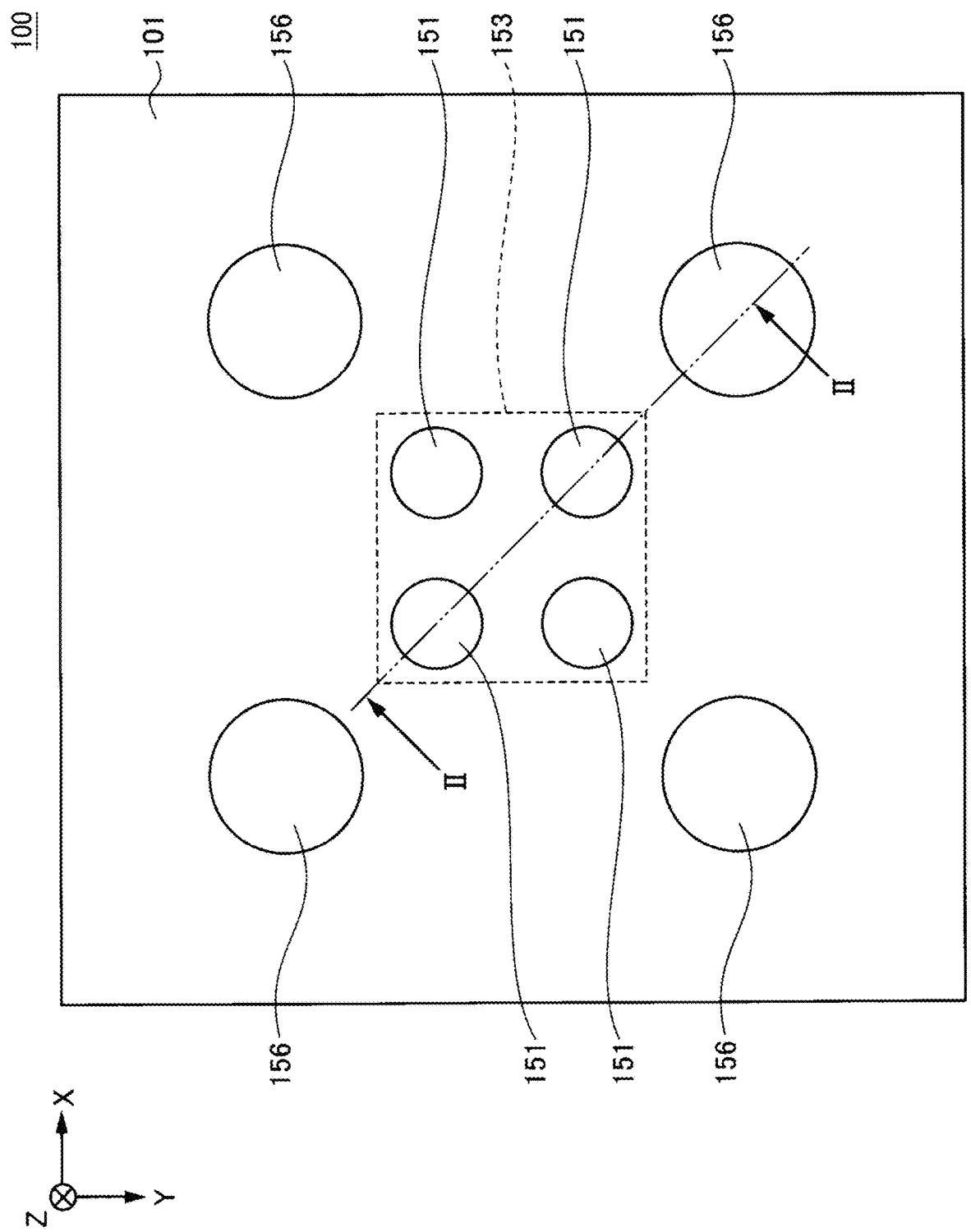
FIG. 1 illustrates a layout of a surface emitting laser according to an embodiment.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

The embodiments of the present disclosure provide a surface emitting laser that achieves higher heat dissipation while increasing the light-emission intensity, a surface emitting laser device incorporating the surface emitting laser, a light source device incorporating the surface emitting laser, and a detection device incorporating the surface emitting laser.

Hereinafter, embodiments of the present disclosure will be described with reference to the accompanying drawings. Note that, in the specification and the drawings, components having substantially the same functional configuration are denoted by the same reference sign, and redundant description may be omitted. In the following description, a laser oscillation direction (an emission direction of a laser beam) is defined as a Z-axis direction, and two directions orthogonal to each other in a plane perpendicular to the Z-axis direction are defined as an X-axis direction and a Y-axis direction in the right-hand system. A positive Z-axis direction is defined as a downward direction. In the description, a plan view refers to a view in the Z-axis direction, that is, a view in a direction perpendicular to a substrate. However, the surface emitting laser or the like may be used in an upside down state, and may be disposed at any desired angle.

A movable device according to a first embodiment is described. The first embodiment relates to a surface emitting laser including a back-emitting surface emitting laser element.

Figure 2:
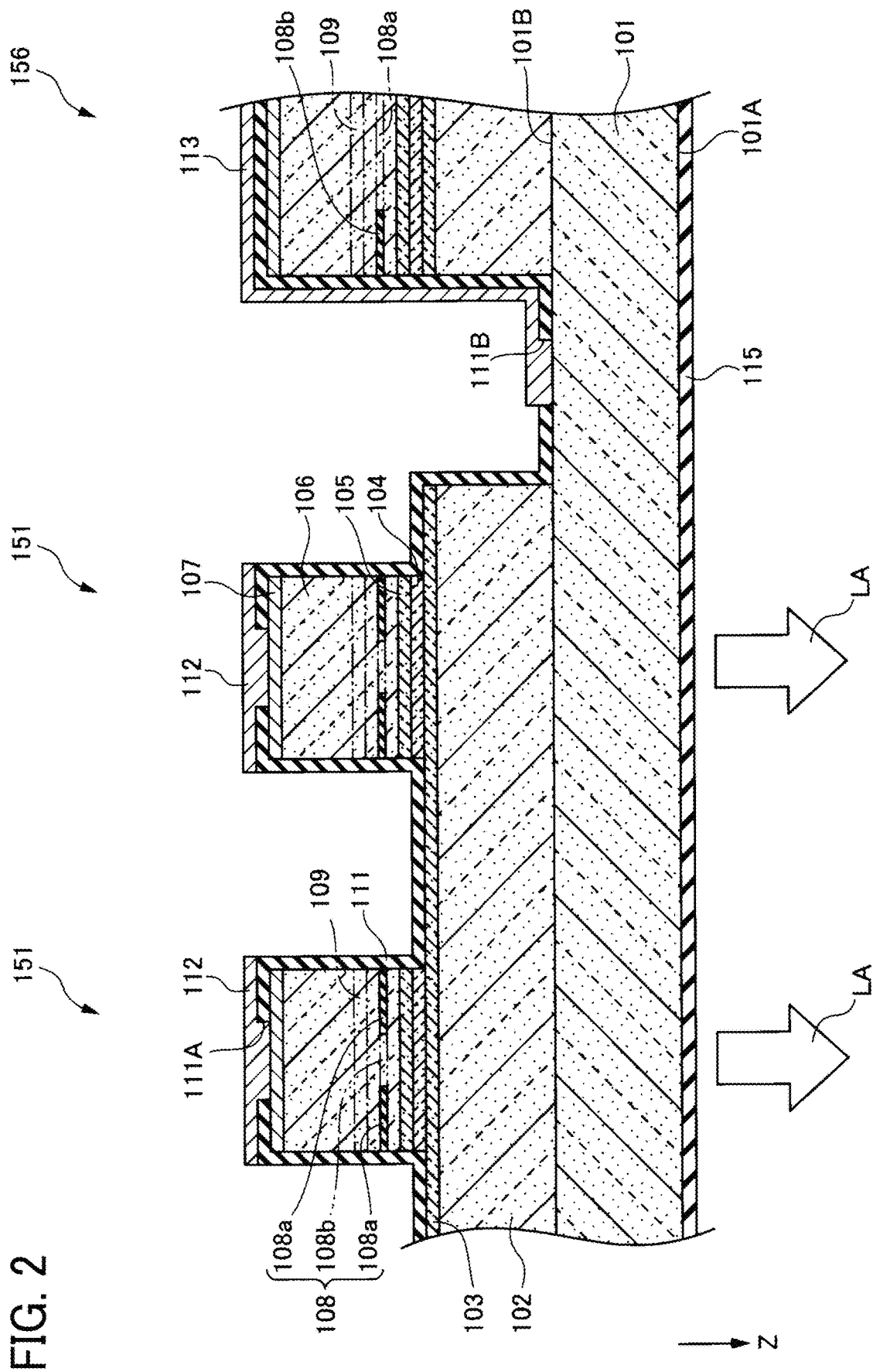
FIG. 2 is a cross-sectional view illustrating an internal structure of the surface emitting laser in FIG. 1.
Figure 3:
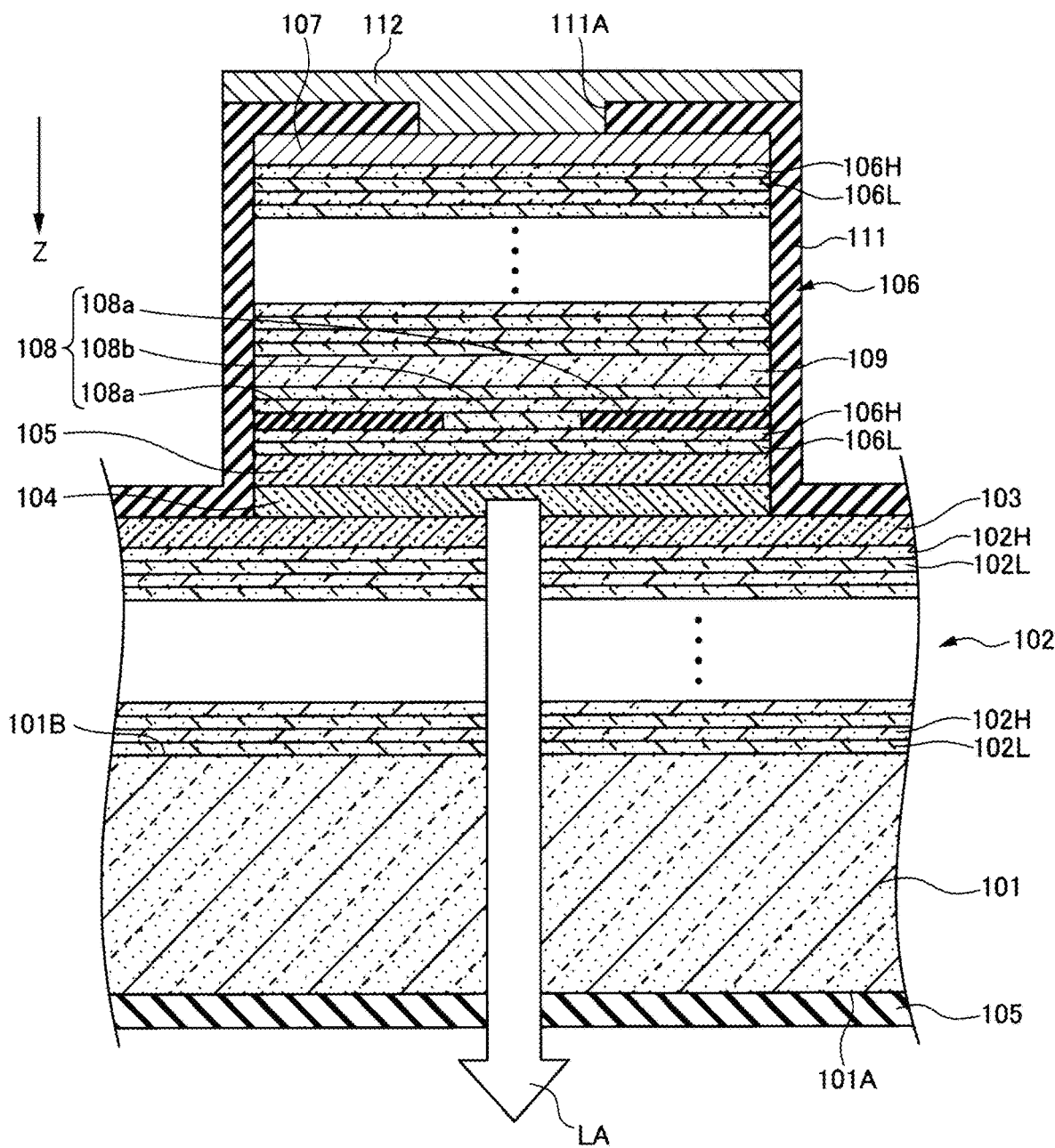
FIG. 3 is a cross-sectional view of the surface emitting laser in FIG. 1.

FIG. 1 is an illustration of a layout of a surface emitting laser according to the first embodiment. FIG. 2 is a cross-sectional view of an internal structure of the surface emitting laser in FIG. 1. FIG. 2 is a cross-sectional view taken along line II-II in FIG. 1. FIG. 3 is a cross-sectional view of the surface emitting laser in FIG. 1. FIG. 3 is an enlarged view of a part of FIG. 2.

As illustrated in FIG. 1, a surface emitting laser 100 according to the first embodiment includes, for example, four surface emitting laser elements 151. The four surface emitting laser elements 151 constitutes a laser element array 153 in which two surface emitting laser elements are arranged in each of the X-axis direction and the Y-axis direction. As illustrated in FIGS. 2 and 3, the surface emitting laser elements 151 each emit a laser beam LA toward aback surface 101A side of a substrate 101. In other words, the surface emitting laser 100 is configured to emit light through a lower reflecting mirror 102 (i.e., a second reflecting mirror) to be described later. Four pads 156 are provided around the laser element array 153 so as to correspond to the surface emitting laser elements 151, respectively.

The pads 156 are electrically connected to the surface emitting laser elements 151, respectively. In this arrangement, selecting a surface emitting laser element 151 to be powered between the surface emitting laser elements 151 changes a target surface emitting laser element 151 to emit light. In other words, the laser element array 153 is a 4-channel individually driven array.

The surface emitting laser 100 is a surface emitting laser with an oscillation wavelength of 940 nanometer (nm) band. As illustrated in FIG. 2, the surface emitting laser 100 includes the substrate 101, a lower reflecting mirror 102 (i.e., the second reflecting mirror), a lower spacer layer 103, an active region 104, an upper spacer layer 105, an upper reflecting mirror 106 (i.e., a first reflecting mirror), an insulator film 111, a contact layer 107, a p-side electrode 112, an n-side electrode 113, and an anti-reflection film 115.

As an example, the substrate 101 is an n-GaAs single-crystal semiconductor substrate in which the normal direction of a mirror-polished surface of a surface (principal surface) is inclined by 15 degrees ($\theta=15$ degrees) in a direction of a crystal orientation [111] A direction with respect to a crystal orientation [100] direction. In other words, the substrate 101 is so-called inclined substrate. Note that the substrate is not limited to the one described above.

The lower reflecting mirror 102 is stacked on the $-Z$ side (upper side) of the substrate 101 via a buffer layer, and has about 26 pairs of a low refractive-index layer 102L made of n-$Al_{0.9}Ga_{0.1}As$ and a high refractive-index layer 102H made of n-$Al_{0.2}Ga_{0.8}As$. A composition-graded layer having a thickness of 20 nm in which the composition gradually changes from one composition to the other composition is provided between the respective refractive-index layers to reduce the electrical resistance between the respective refractive-index layers. Each of the refractive-index layers includes ½ of the adjacent composition-graded layer, and has an optical thickness of $\lambda/4$, where $\lambda$ denotes an oscillation wavelength. Note that when the optical thickness is $\lambda/4$, the actual thickness D of the layer is $D=\lambda/4n$ (where n denotes a refractive index of a medium of that layer).

The lower spacer layer 103 is a layer that is stacked on the $-Z$ side (i.e., upper side) of the lower reflecting mirror 102 and is made of non-doped $Al_{0.2}Ga_{0.75}As$. The material of the lower spacer layer 103 is not limited to non-doped $Al_{0.25}Ga_{0.75}As$, and may be, for example, non-doped AlGaInP.

The active region 104 is an active region that is stacked on the $-Z$ side (i.e., the upper side) of the lower spacer layer 103 and has a structure of a multi-quantum well (MQW) including a plurality of quantum well layers and a plurality of barrier layers. The quantum well layers are made of InGaAs, and each barrier layer is made of AlGaAs.

The upper spacer layer 105 is a layer that is stacked on the $-Z$ side (i.e., the upper side) of the active region 104 and is made of non-doped $Al_{0.25}Ga_{0.75}As$. Like the lower spacer layer 103, the material of the upper spacer layer 105 is not limited to non-doped $Al_{0.25}Ga_{0.75}As$, and may be, for example, non-doped AlGaInP.

The portion including the lower spacer layer 103, the active region 104, and the upper spacer layer 105 is also referred to as a resonator structure, and the thickness thereof is an optical thickness corresponding to one wavelength. Note that the active region 104 is provided at the center of the resonator structure, which is a position corresponding to the antinode in the standing wave distribution of the electric field, so as to obtain a high induced emission rate. In one example, the thicknesses of the respective layers of the lower spacer layer 103, the active region 104, and the upper spacer layer 105 are set so that single longitudinal mode oscillation is obtained at an oscillation wavelength of 940 nm. In another example, the relative relationship (detuning) between the resonance wavelength and the emission wavelength (composition) of the active region 104 is adjusted so that the oscillation threshold current of the surface emitting laser element 151 is the smallest at room temperature.

The upper reflecting mirror 106 is stacked on the $-Z$ side (upper side) of the upper spacer layer 105, and has about 30 pairs of a low refractive-index layer made of p-$Al_{0.9}Ga_{0.1}As$ and a high refractive-index layer made of p-$Al_{0.2}Ga_{0.8}As$. A composition-graded layer in which the composition gradually changes from one composition to the other composition is provided between the respective refractive-index layers to reduce the electrical resistance between the respective refractive-index layers.

In one of the low refractive-index layers 106L of the upper reflecting mirror 106, a selective oxide layer 108 made of p-AlAs and with a thickness of about 30 nm are inserted. The position of the selective oxide layer 108 corresponds to, for example, the second node from the active region 104 in the standing wave distribution of the electric field. The selective oxide layer 108 includes a non-oxidized region 108b and an oxidized region 108a surrounding the non-oxidized region 108b. Any region other than the selective oxide layer 108 in the low refractive-index layers 106L includes ½ of the adjacent composition-graded layer, and has an optical thickness of $\lambda/4$.

In one of the high refractive-index layer 106H of the upper reflecting mirror 106, a high thermal-conductive layer 109 made of p-GaAs is inserted. The high thermal-conductive layer 109 includes ½ of the adjacent composition-graded layer, and has an optical length of 3V4 where k denotes the oscillation wavelength. The high thermal-conductive layer 109 is provided, for example, on the opposite side of the active region 104 side relative to the selective oxide layer 108. The high refractive-index layer 106H except for the high thermal-conductive layer 109 includes ½ of the adjacent composition-graded layer, and has an optical length of $\lambda/4$ where $\lambda$ denotes the oscillation wavelength.

The contact layer 107 is a layer that is stacked on the −Z side (i.e., upper side) of the upper reflecting mirror 106 and is made of p-GaAs.

The anti-reflection film 115 is formed on the +Z (lower side) surface (back surface 101A) of the substrate 101. The anti-reflection film 115 is a non-reflective coating film for the oscillation wavelength of 940 nm.

In the surface emitting laser element 151, the stacked layers of the contact layer 107, the upper reflecting mirror 106, the upper spacer layer 105, and the active region 104 has a mesa structure. The bottom portion of the mesa structure be in the middle of the resonator structure, and may be on the upper surface of the upper spacer layer 105. The non-oxidized region 108b is located at the center of the mesa structure in plan view.

In the surface emitting laser element 151, the insulator film 111 covers the stacked structure of the contact layer 107, the upper reflecting mirror 106, the upper spacer layer 105, the active region 104, and the lower spacer layer 103. The insulator film 111 is, for example, a silicon nitride (SiN) film. An opening 111A is formed in the insulator film 111 to expose a portion of the upper surface of the contact layer 107. The p-side electrode 112 is formed on the insulator film 111. The p-side electrode 112 is in contact with the upper surface of the contact layer 107 via the opening 111A. The p-side electrode 112 includes, for example, a titanium (Ti) film, a platinum (Pt) film, and a gold (Au) film sequentially stacked on the −Z side (upper side). The p-side electrode 112 of the surface emitting laser element 151 is coupled to a p-side electrode of a driver integrated circuit (IC) or a submount by flip-chip mounting.

In each pad 156, the stacked layers of the contact layer 107, the upper reflecting mirror 106, the upper spacer layer 105, and the active region 104 has a mesa structure. Further, a groove 122 is formed in the stacked layers of the lower spacer layer 103 and the lower reflecting mirror 102 around the pad 156.

In the pad 156, the insulator film 111 covers the contact layer 107, the upper reflecting mirror 106, the upper spacer layer 105, the active region 104, the lower spacer layer 103, the lower reflecting mirror 102, and the substrate 101. An opening 111B is formed in the insulator film 111 to expose a portion of a surface 101B of the substrate 101 at the bottom of the groove 122. The n-side electrode 113 is formed on the insulator film 111. Then-side electrode 113 is in contact with the surface 101B of the substrate 101 inside the opening 111B. The n-side electrode 113 is partly disposed at the −Z side (i.e., the upper side) relative to the upper reflecting mirror 106 in the pad 156. The n-side electrode 113 includes, for example, a gold-germanium alloy (AuGe) film, a nickel (Ni) film, and a gold (Au) film sequentially stacked on the −Z side (upper side). The n-side electrode 113 is coupled to an n-side electrode of a driver IC or a submount by flip-chip mounting in the pad 156.

The electric potential difference between the p-side electrode 112 and the n-side electrode 113 cause a voltage to be applied to the active region 104. The surface emitting laser 100 may be packaged.

Figure 4:
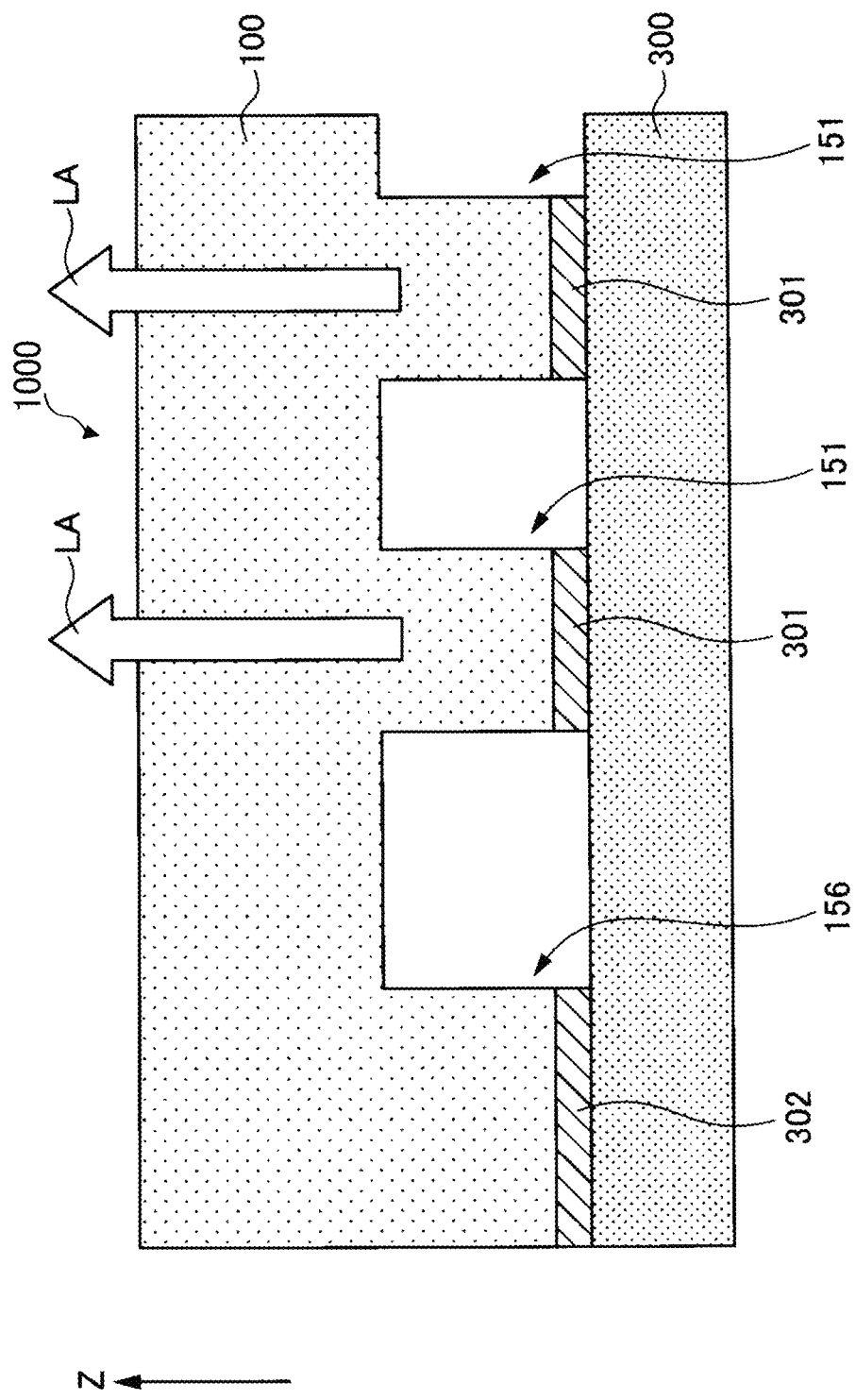
FIG. 4 is a schematic view of an example case where the surface emitting laser in FIG. 1 is used.

The surface emitting laser 100 is mounted on, for example, a submount. FIG. 4 is a schematic view of an example case where the surface emitting laser 100 in FIG. 1 is used. The submount and the surface emitting laser 100 mounted on the submount are included in a surface emitting laser device 1000.

In this example of use, as illustrated in FIG. 4, the surface emitting laser 100 is mounted on a driver IC 300 by flip-chip mounting. The p-side electrode 112 of the surface emitting laser element 151 is electrically coupled to a p-side electrode provided on the driver IC 300 via a conductive body 301. The n-side electrode 113 of the surface emitting laser element 151 is electrically coupled to an n-side electrode provided on the driver IC 300 via a conductive body 302 in the pad 156. The surface emitting laser 100 is driven by the driver IC 300. For example, the driver IC 300 has a larger area than the substrate 101. The driver IC 300 is an example of a driver for a surface emitting laser.

The object on which the surface emitting laser 100 is mounted is not limited to the driver IC 300. For example, the surface emitting laser 100 may be mounted on a submount.

Figure 5:
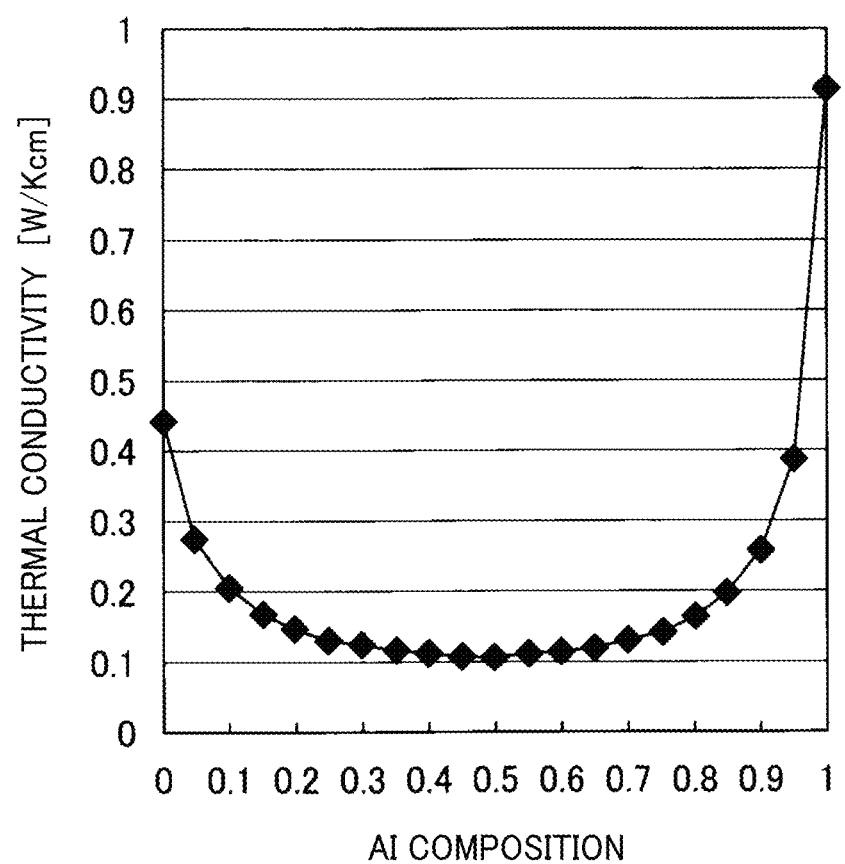
FIG. 5 is a graph of Al composition and thermal conductivity in AlGaAs.

The following describes the action and effects of the surface emitting laser 100. FIG. 5 is a graph of Al composition and thermal conductivity in AlGaAs. As illustrated in FIG. 5, GaAs used for the high thermal-conductive layer 109 has a higher thermal conductivity than $Al_{0.2}Ga_{0.8}As$ used for another high refractive-index layer 106H. Further, the high thermal-conductive layer 109 is thicker than said another high refractive-index layer 106H. The high thermal-conductive layer 109 is more capable of diffusing heat in the in-plane direction (i.e., a direction perpendicular to the thickness direction) than said another high refractive-index layer 106H. In other words, the high thermal-conductivity layer 109 has a higher thermal diffusion property in the in-plane direction than said another high refractive-index layer 106H. In the first embodiment, the heat generated in the active region 104 first diffuses mainly in the thickness direction, that is, in the Z-axis direction. The heat diffused in the −Z direction (i.e., a direction toward the upper side) reaches the high thermal-conductive layer 109, diffuses in the in-plane direction of the high thermal-conductive layer 109, and further diffuses in the −Z direction (i.e., direction toward the upper side). In this way, the heat generated in the active region 104 is widely diffused and released to the outside of the surface emitting laser.

As the p-side electrode 112 is connected to the p-side electrode on the driver IC 300 via the conductive body 301, the heat that has reached the p-side electrode 112 is also transferred to the driver IC 300. The heat that has reached the driver IC 300 is diffused much more widely because the driver IC 300 is wider than the substrate 101.

The configuration according to the first embodiment exhibits better heat dissipation property.

As illustrated in FIG. 5, AlAs has a higher thermal conductivity than GaAs. In view of such thermal properties, AlAs is used for the low refractive-index layers 106L to increase the thermal conductivity. However, if AlAs is used for the low refractive-index layers 106L AlAs would be oxidized during the manufacturing process to be described below, and thus the property of the surface emitting laser elements 151 might decrease. In addition, AlAs are easily corroded, which might reduce reliability of the surface emitting laser elements 151. In view of this, a material having a high Al composition and good thermal conductivity, such as AlAs, cannot be used for the low refractive-index layers 106L.

In AlGaAs, as the Al composition is lower, the band gap becomes lower and the AlGaAs is more likely to absorb light with a wavelength of 940 nm. Further, the electric field intensity become higher as its position is closer to the active region 104. In particular, when the resonator structure has an optical length of nλ (n is a natural number), the electric field intensity is higher because the resonator structure has its end at the antinode of the standing wave. For this reason, if the high thermal-conductive layer 109 of a low Al composition is closer to the active region 104 than the upper reflecting mirror 106, the high thermal-conductive layer 109 would be more likely to absorb light generated in the active region 104. In the first embodiment, however, the high thermal-conductive layer 109 is disposed within the upper reflecting mirror 106 to be away from the active region 104. This configuration enables the high thermal-conductive layer 109 to be less likely to absorb the light. Thus, the optical loss due to the light absorption is reduced or prevented, and the surface emitting laser can emit light with a higher intensity.

A method of manufacturing the surface emitting laser 100 is described next. Note that a structure in which a plurality of semiconductor layers are stacked on the substrate 101 as described above is also referred to as a stacked layers or a stacked body in the following description. FIGS. 6 to 11 are cross-sectional views for describing a method of manufacturing the surface emitting laser 100 according to the first embodiment.

Figure 6:
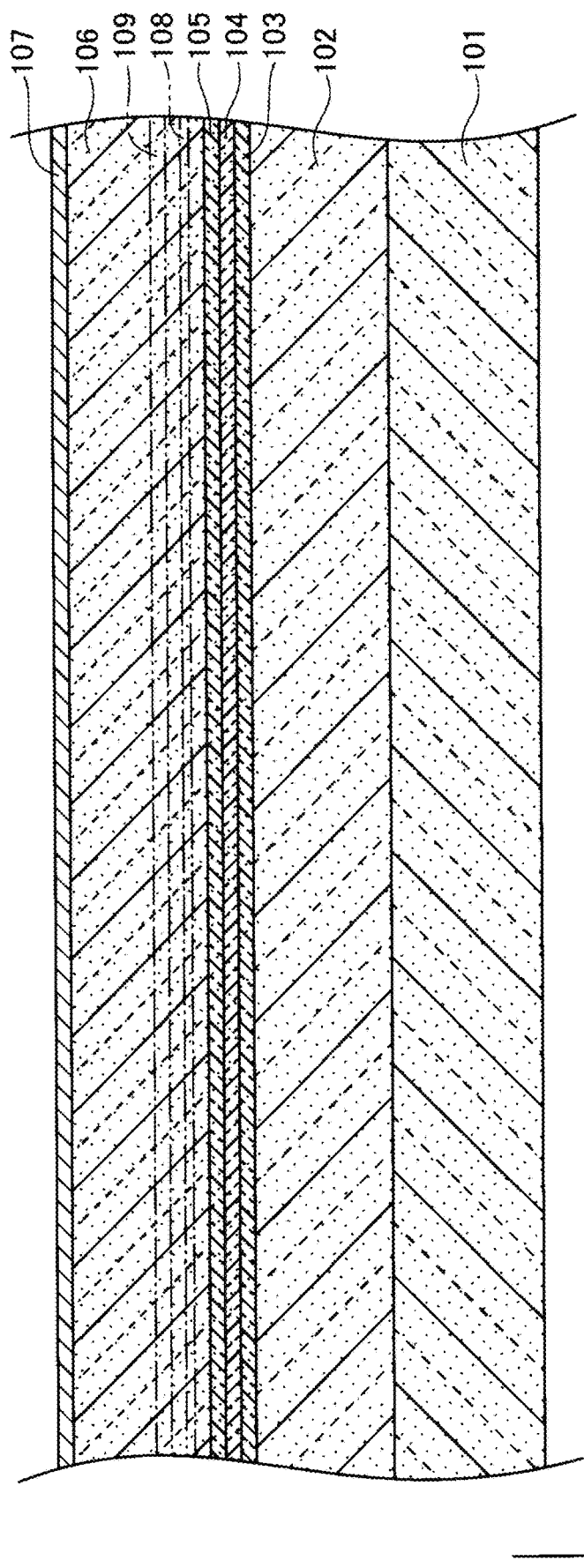
FIG. 6 is a cross-sectional view of the surface emitting laser in FIG. 1 for describing a method of manufacturing the surface emitting laser.

First, as illustrated in FIG. 6, the stacked body is formed by crystal growth by a metal organic chemical vapor deposition (MOCVD) method or a molecular beam epitaxy (MBE) method.

In the case of the MOCVD method, trimethyl aluminum (TMA), trimethyl gallium (TMG), or trimethyl indium (TMI) is used as the raw material of the group III; and phosphine ($PH_3$) or arsine ($AsH_3$) is used as the raw material of the group V. Carbon tetrabromide ($CBr_4$) or dimethyl zinc (DMZn) is used as the raw material of the p-type dopant; and hydrogen selenide ($H_2Se$) is used as the raw material of the n-type dopant.

Figure 7:
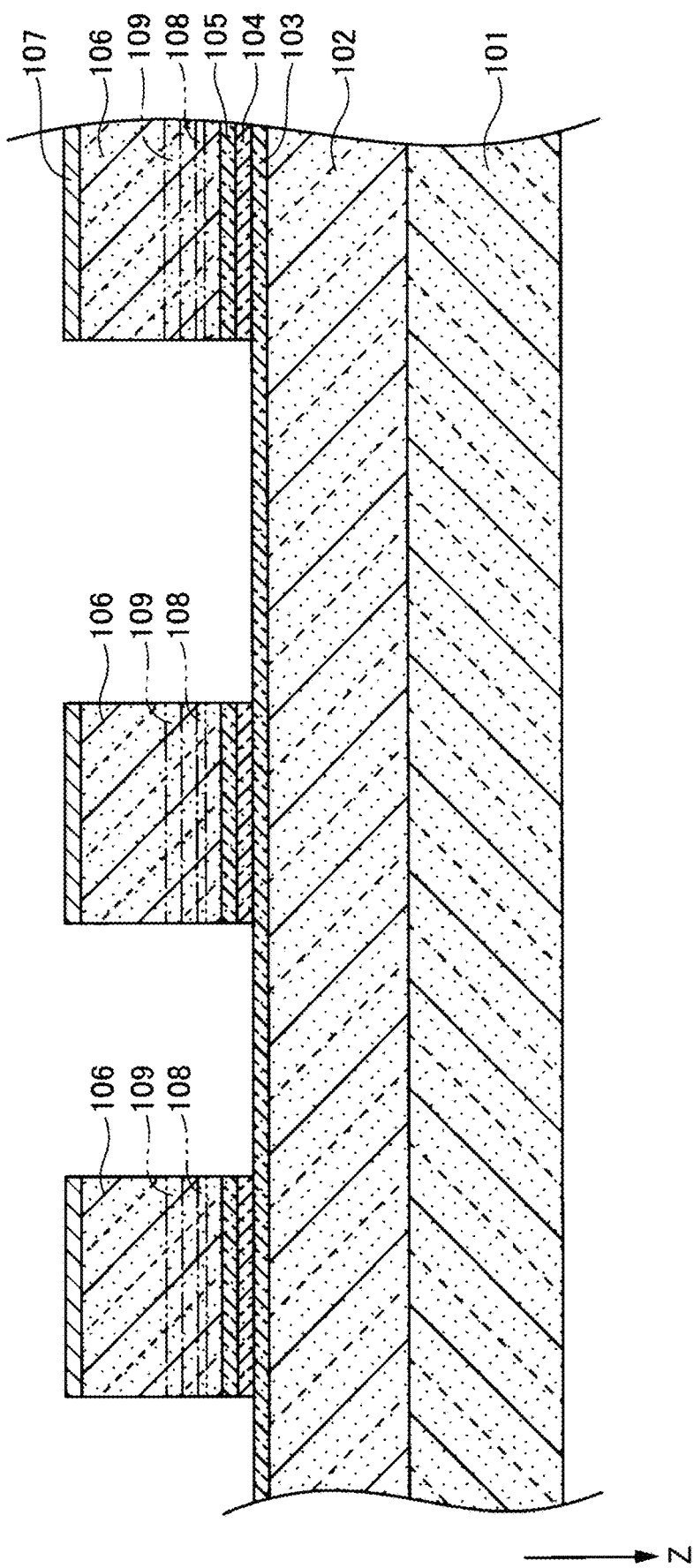
FIG. 7 is another cross-sectional view of the surface emitting laser in FIG. 1 for describing the method of manufacturing the surface emitting laser.

As illustrated in FIG. 7, a mesa structure is formed in the regions corresponding to the surface emitting laser elements 151 and the regions corresponding to the pads 156 by etching the contact layer 107, the upper reflecting mirror 106, the upper spacer layer 105, and the active region 104. As the etching, for example, inductively coupled plasma (ICP) dry etching or electron cyclotron resonance (ECR) dry etching can be performed.

Figure 8:
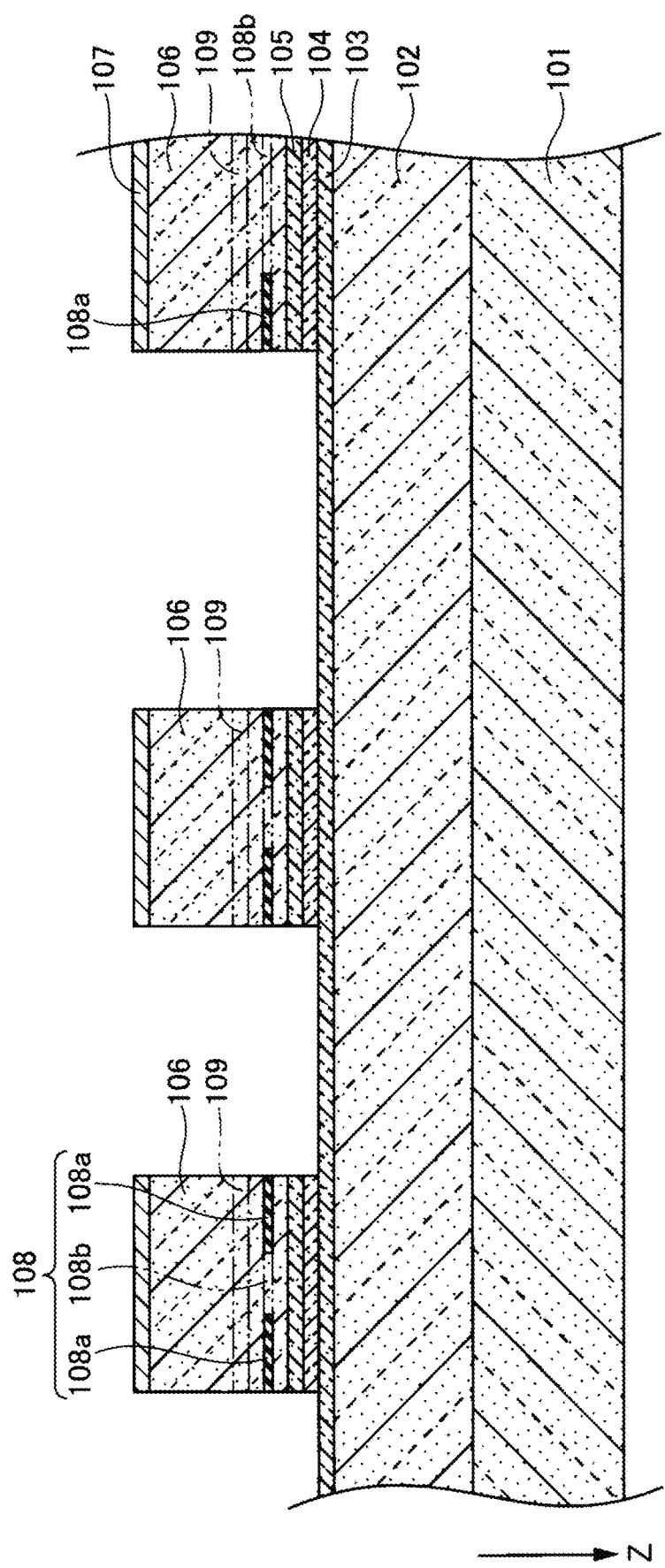
FIG. 8 is another cross-sectional view of the surface emitting laser in FIG. 1 for describing the method of manufacturing the surface emitting laser.

Thereafter, as illustrated in FIG. 8, the stacked layers are subjected to heat treatment in water vapor. As a result, Al (aluminum) in the selective oxide layer 108 is selectively oxidized from the outer peripheral portion of the mesa structure, and the non-oxidized region 108b surrounded by the oxidized region 108a of Al remains in the center portion of the mesa structure. That is, a so-called oxidized confinement structure is formed to restrict the path of the driving current of a light emitter to the center portion of the mesa structure. The non-oxidized region 108b is a current passing region.

When the low refractive-index layers 106L is formed from material, such as AlAs that is high Al composition with a high thermal conductivity, the low refractive-index layers 106L might be oxidized like the selective oxide layer 108 during the formation of the oxidized region 108a. The high thermal-conductive layer 109, however, which is formed from GaAs, is not oxidized but remains unchanged as illustrated in FIG. 8.

Figure 9:
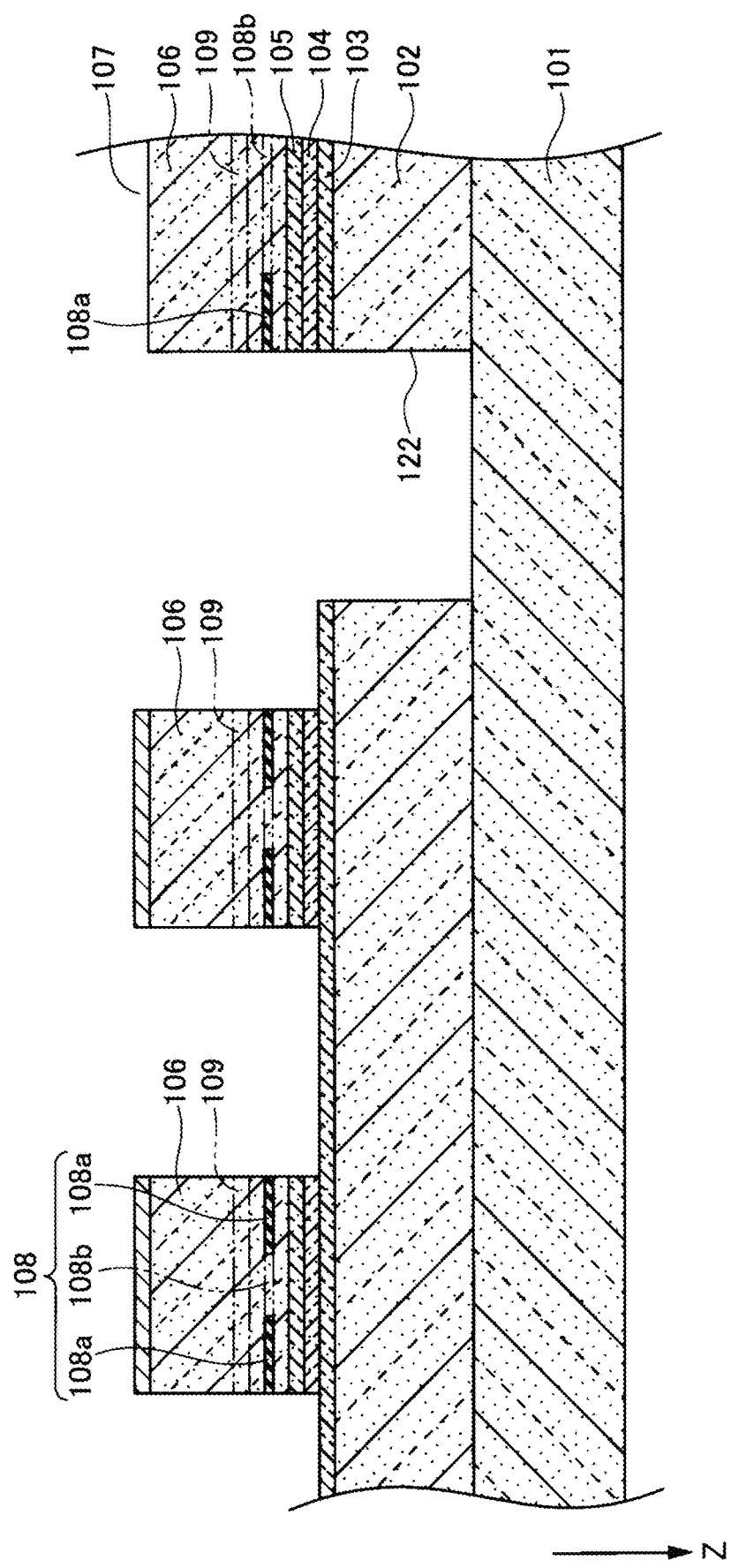
FIG. 9 is another cross-sectional view of the surface emitting laser in FIG. 1 for describing the method of manufacturing the surface emitting laser.

As illustrated in FIG. 9, a groove 122 is formed by etching the lower spacer layer 103 and the lower reflecting mirror 102 around the pad 156. The etching for forming the groove 122 after the selective oxidation of the selective oxide layer 108 prevents damage to the selective oxide layer 108 before the selective oxidation.

Figure 10:
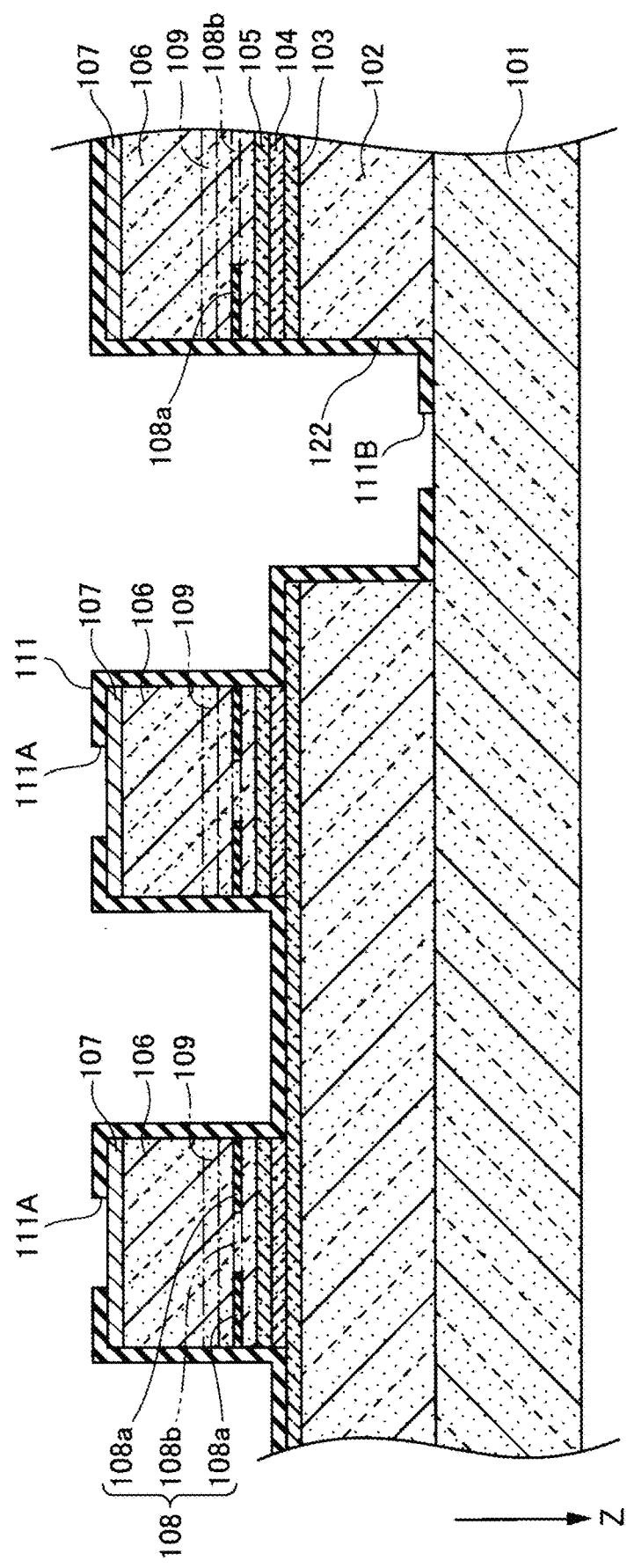
FIG. 10 is another cross-sectional view of the surface emitting laser in FIG. 1 for describing the method of manufacturing the surface emitting laser.

As illustrated in FIG. 10, the insulator film 111 is formed on the entire surface on the front surface 101B side of the substrate 101. The insulator film 111 is formed by, for example, a chemical vapor deposition (CVD) method. Subsequently, the openings 111A and 111B are formed in the insulator film 111. The openings 111A and 111B are formed by wet etching using, for example, buffered hydrofluoric acid (BHF).

Figure 11:
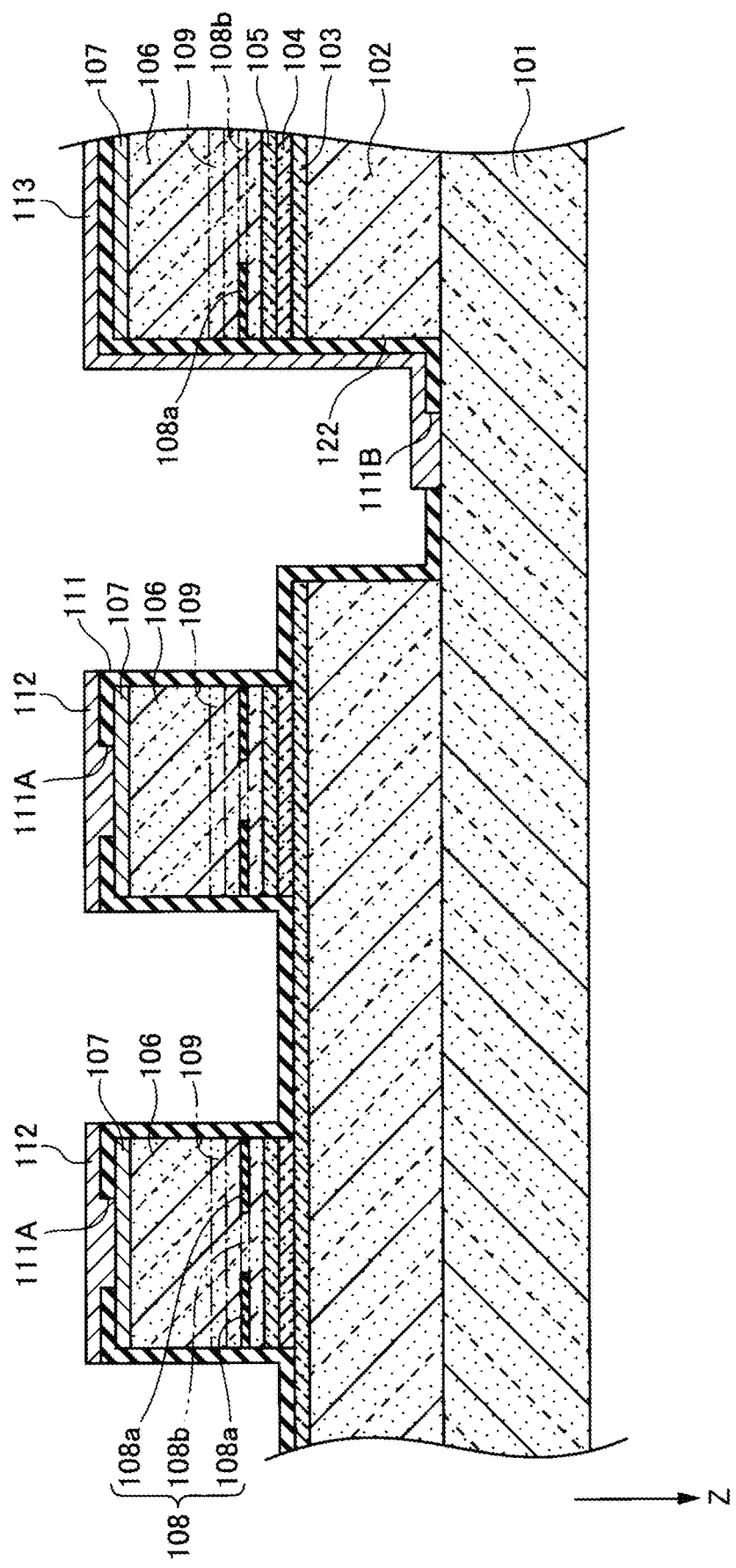
FIG. 11 is another cross-sectional view of the surface emitting laser in FIG. 1 for describing the method of manufacturing the surface emitting laser.

As illustrated in FIG. 11, the p-side electrode 112 is formed in the region corresponding to the surface emitting laser elements 151, and the n-side electrode 113 is formed in the region corresponding to the pad 156. The p-side electrode 112 and the n-side electrode 113 are formed by, for example, a lift-off method. Either of the p-side electrode 112 and the n-side electrode 113 may be formed first. To form the p-side electrode 112 and the n-side electrode 113, after the film formation, heat treatment is performed in a reducing atmosphere or an inert atmosphere, and ohmic conduction is established by the eutectic reaction of the semiconductor material and the electrode material.

Thereafter, the back surface 101A of the substrate 101 is polished and mirror-finished, and the anti-reflection film 115 is formed on the back surface 101A (see FIG. 2).

In this way, the surface emitting laser 100 is manufactured.

The high thermal-conductive layer 10) may be disposed closer to the active region 104 than the selective oxide layer 108, or may be farther away from the active region 104 than the selective oxide layer 108.

To achieve intended performance, at least one set of one low refractive-index layer 106L and another high refractive-index layer 106H is disposed between the high thermal-conductive layer 109 and the active region 104. This arrangement enables the high thermal-conductive layer 109 to be separate from the active region 104 so as to prevent light absorption of the high thermal-conductive layer 109 more effectively.

The composition of the high thermal-conductive layer 109 is not limited to GaAs and may be AlGaAs having a lower Al composition than another high refractive-index layer 106H. For example, when another high refractive-index layer 106H is formed from material of $Al_{0.2}Ga_{0.8}As$, the high thermal-conductive layer 109 may have a composition of $Al_{0.1}Ga_{0.9}As$ or $Al_{0.05}Ga_{0.95}As$.

When the high thermal-conductive layer 109 is thicker than another high refractive-index layer 106H, the high thermal-conductive layer 109 may be formed from material with the approximately same thermal conductivity as the material of the high refractive-index layer 106H. When the high thermal-conductive layer 109 has a higher thermal conductivity in material than the high refractive-index layer 106H, the high thermal-conductive layer 109 may have approximately same thickness as another high refractive-index layer 106H. The high thermal-conductive layer 109 may have an optical thickness of (2n+1) λ/4, for example, where n is a natural number. In the present disclosure, when the composition gradient layer is provided adjacent to the high thermal-conductive layer 109, the optical thickness of the high thermal-conductive layer 109 includes ½ of the thickness of the composition gradient layer.

The number of the high thermal-conductive layer 109 is not limited to one, and a plurality of high thermal-conductive layers 109 may be included in the upper reflecting mirror 106.

The number of the surface emitting laser elements 151 is not limited. Further, the present disclosure is not limited to the configuration in which a plurality of surface emitting laser elements 151 are individually driven. In some examples, a plurality of surface emitting laser elements 151 is collectively driven. One pad 156 may be provided for the plurality of surface emitting laser elements 151. For example, one pad 156 may be commonly provided for four surface emitting laser elements 151.

In some example, an electrode film is replaced with the pad 156, to be provided on the back surface 101A from which a laser beam LA is emitted.

Figure 12:
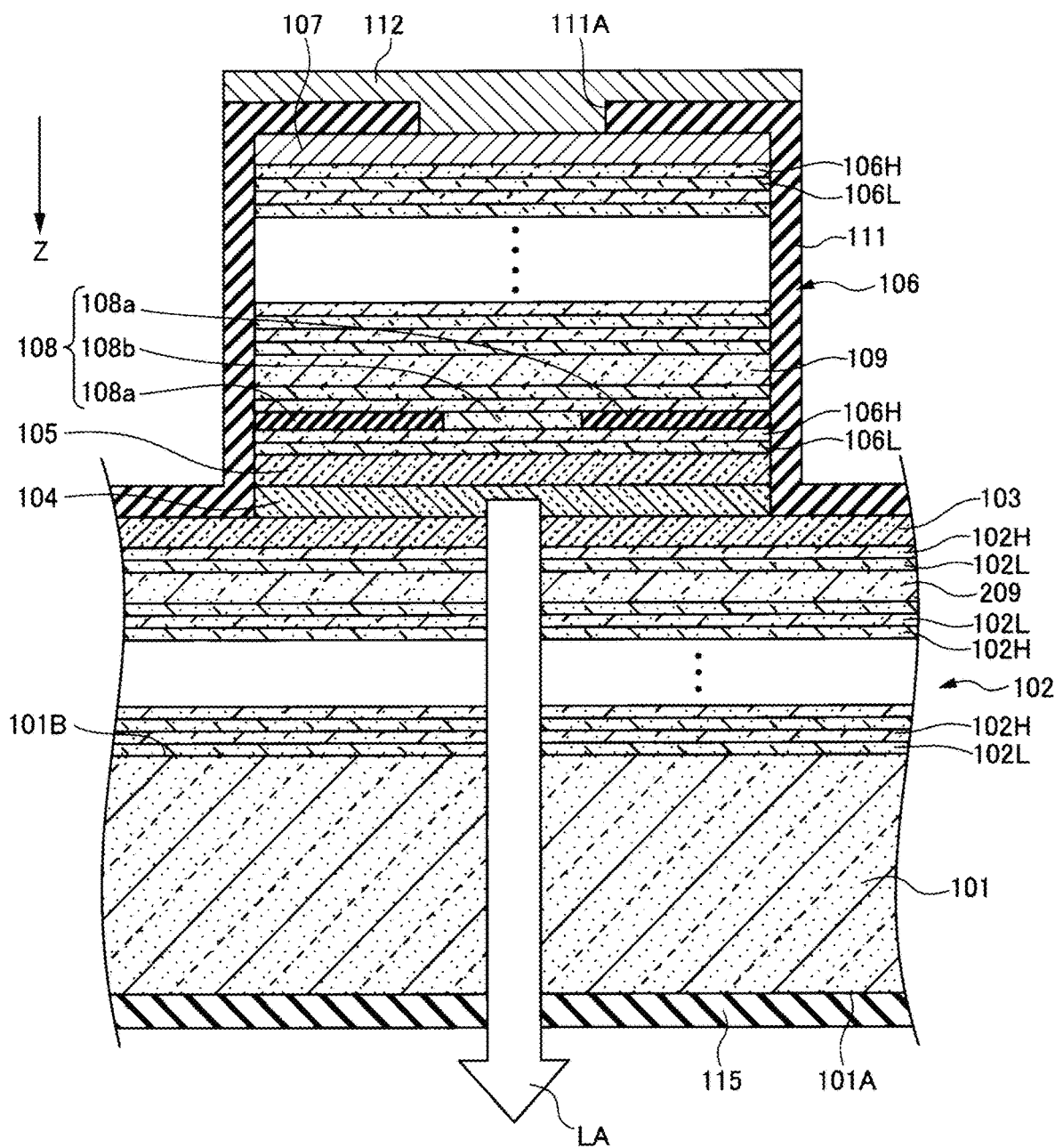
FIG. 12 is a cross-sectional view of a surface emitting laser according to another embodiment.

The following describes a second embodiment. The second embodiment differs from the first embodiment in that the lower reflecting mirror also includes a high thermal-conductive layer. FIG. 12 is a cross-sectional view of the surface emitting laser in FIG. 2.

In the second embodiment of FIG. 12, one of the high refractive-index layer 102H of the upper reflecting mirror 102 includes a high thermal-conductive layer 209 made of n-GaAs inserted. The high thermal-conductive layer 209 includes ½ of the adjacent composition-graded layer, and has an optical length of 3λ/4 where λ denotes the oscillation wavelength. The high refractive-index layer 102H except for the high thermal-conductive layer 209 includes ½ of the adjacent composition-graded layer, and has an optical length of λ/4 where λ denotes the oscillation wavelength.

The other configurations are similar to those in the first embodiment.

In the second embodiment, the heat generated in the active region 104 first diffuses mainly in the thickness direction, that is, in the Z-axis direction. Same as in the first embodiment, the heat diffused in the −Z direction (i.e., direction toward the upper side) reaches the high thermal-conductive layer 109, diffuses in the in-plane direction of the high thermal-conductive layer 109, and further diffuses in the −Z direction (i.e., direction toward the upper side). The heat diffused in the +Z direction (i.e., direction toward the lower side) reaches the high thermal-conductive layer 209, and diffuses in the in-plane direction of the high thermal-conductive layer 209, and further diffuses in the +Z direction (i.e., direction toward the lower side). In this way, the heat generated in the active region 104 is widely diffused and released to the outside of the surface emitting laser.

The configuration according to the second embodiment exhibits better heat dissipation property.

To achieve intended performance, at least one set of one low refractive-index layer 102L and another high refractive-index layer 102H is disposed between the high thermal-conductive layer 209 and the active region 104. This arrangement enables the high thermal-conductive layer 209 to be separate from the active region 104 so as to prevent light absorption of the high thermal-conductive layer 209 more effectively.

The number of the high thermal-conductive layer 209 is not limited to one, and a plurality of high thermal-conductive layers 209 may be included in the lower reflecting mirror 102.

Figure 13:
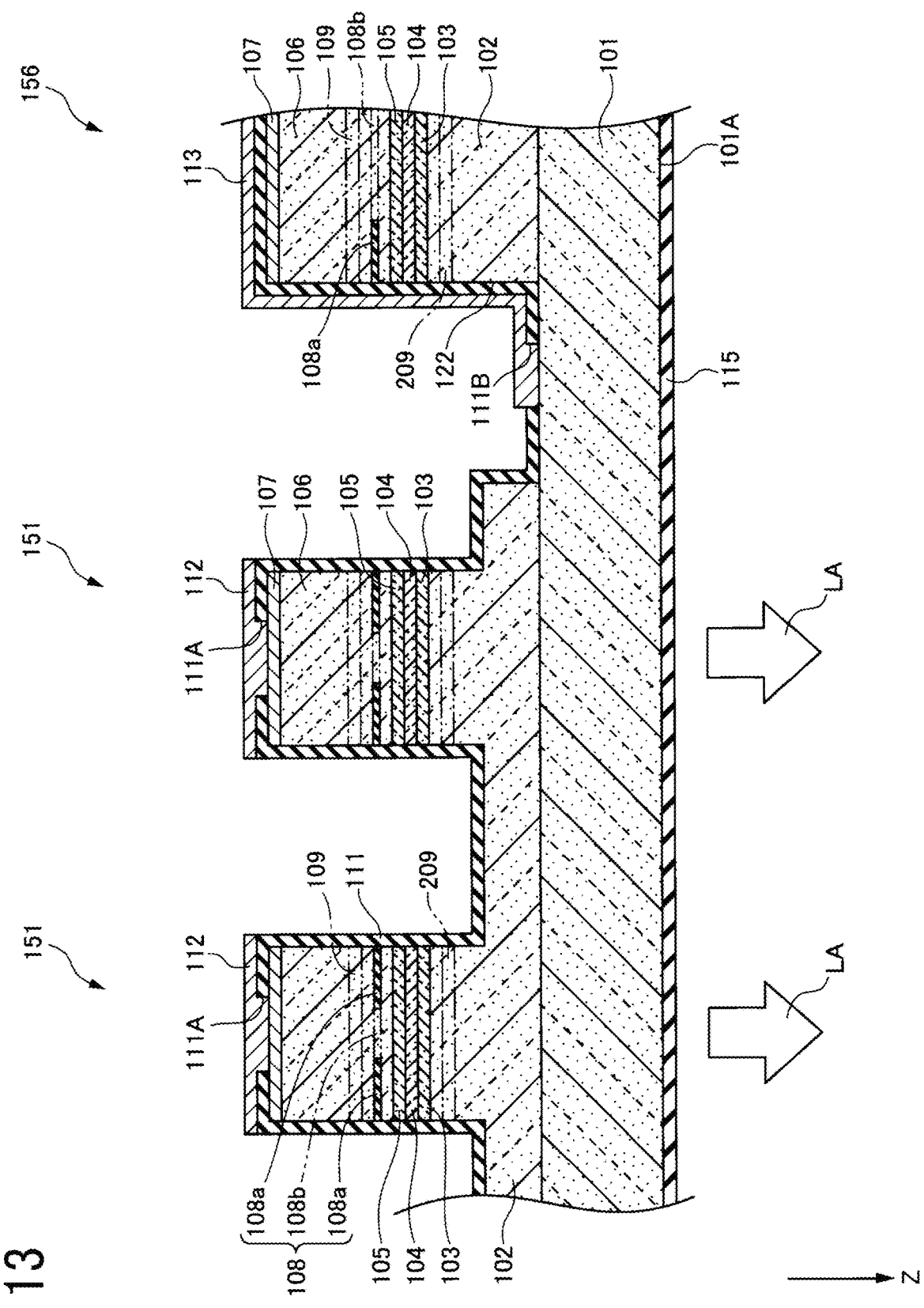
FIG. 13 is a cross-sectional view of an internal structure of a surface emitting laser according to another embodiment.
Figure 14:
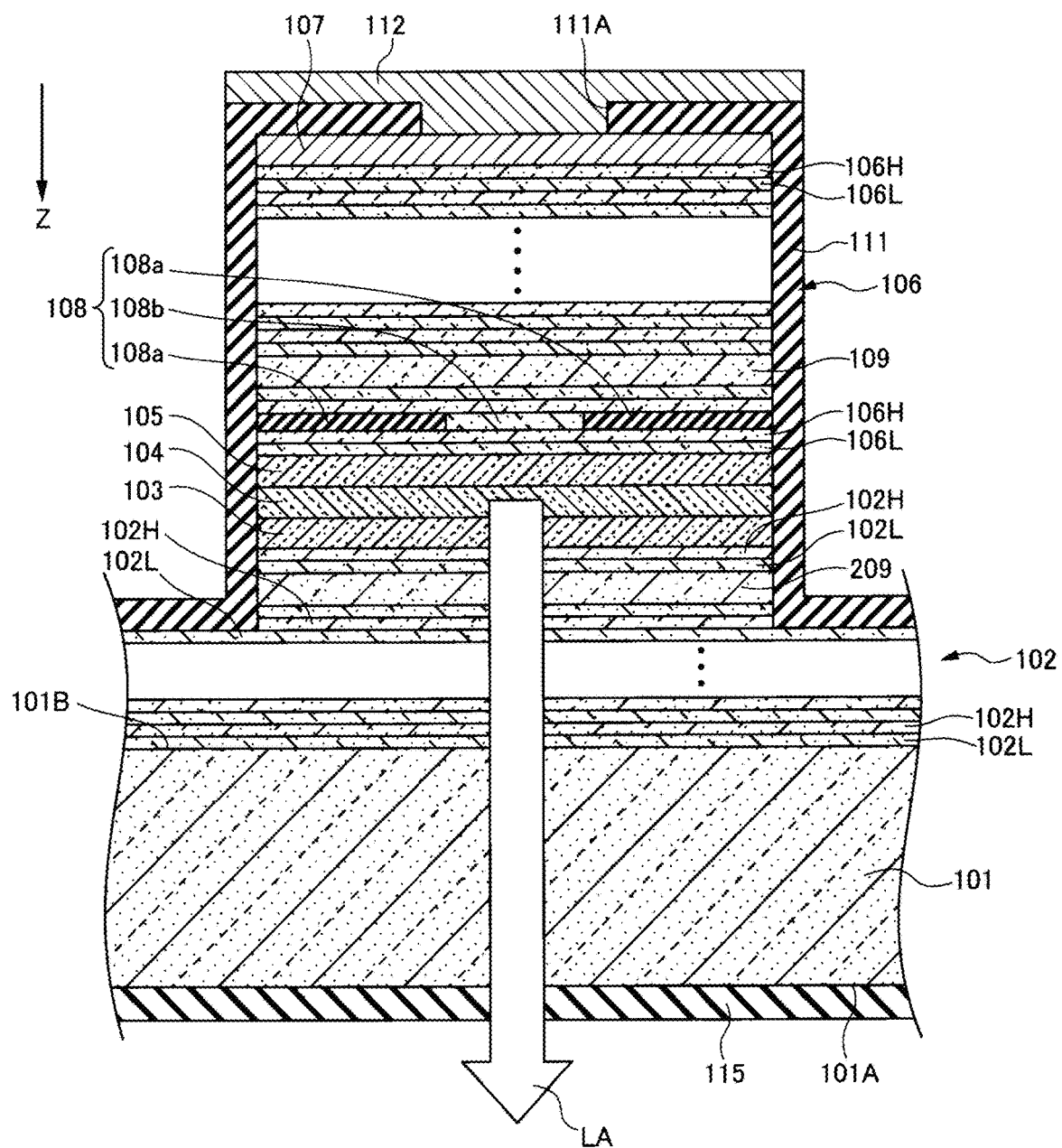
FIG. 14 is a cross-sectional view of a mesa structure of the surface emitting laser element in FIG. 13.

The following describes a third embodiment. The third embodiment differs from the second embodiment in the mesa structure. FIG. 13 is a cross-sectional view of an internal structure of the surface emitting laser according to the third embodiment. FIG. 14 is a cross-sectional view of a mesa structure of the surface emitting laser element in FIG. 13. FIG. 14 is an enlarged view of a part of FIG. 13.

In the third embodiment as illustrated in FIG. 13, the stacked layers of the contact layer 107, the upper reflecting mirror 106, the upper spacer layer 105, the active region 104, the lower spacer layer 103, and the lower reflecting mirror 102 has a mesa structure. In other words, the bottom of the mesa structure is in the middle of the lower reflecting mirror 102. More specifically, as illustrated in FIG. 14, the bottom of the mesa structure is closer to the substrate 101 than the high thermal-conductive layer 209, and a separate high thermal-conductive layer 209 is provided in each mesa structure of the surface emitting laser elements 151.

The other configurations are similar to those in the second embodiment.

The third embodiment also attains effects similar to those of the second embodiment.

Figure 15:
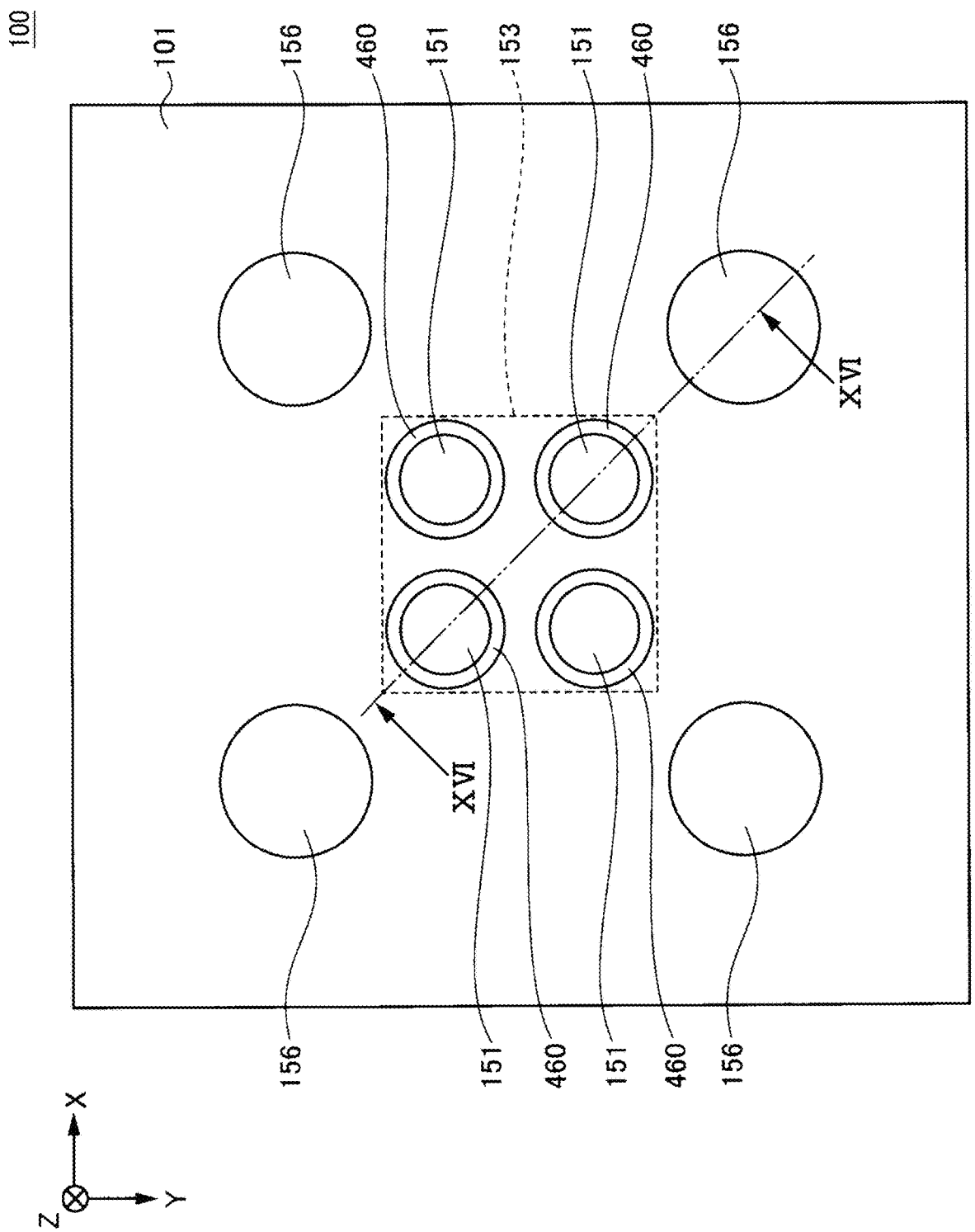
FIG. 15 is an illustration of a layout of a surface emitting laser according to another embodiment.
Figure 16:
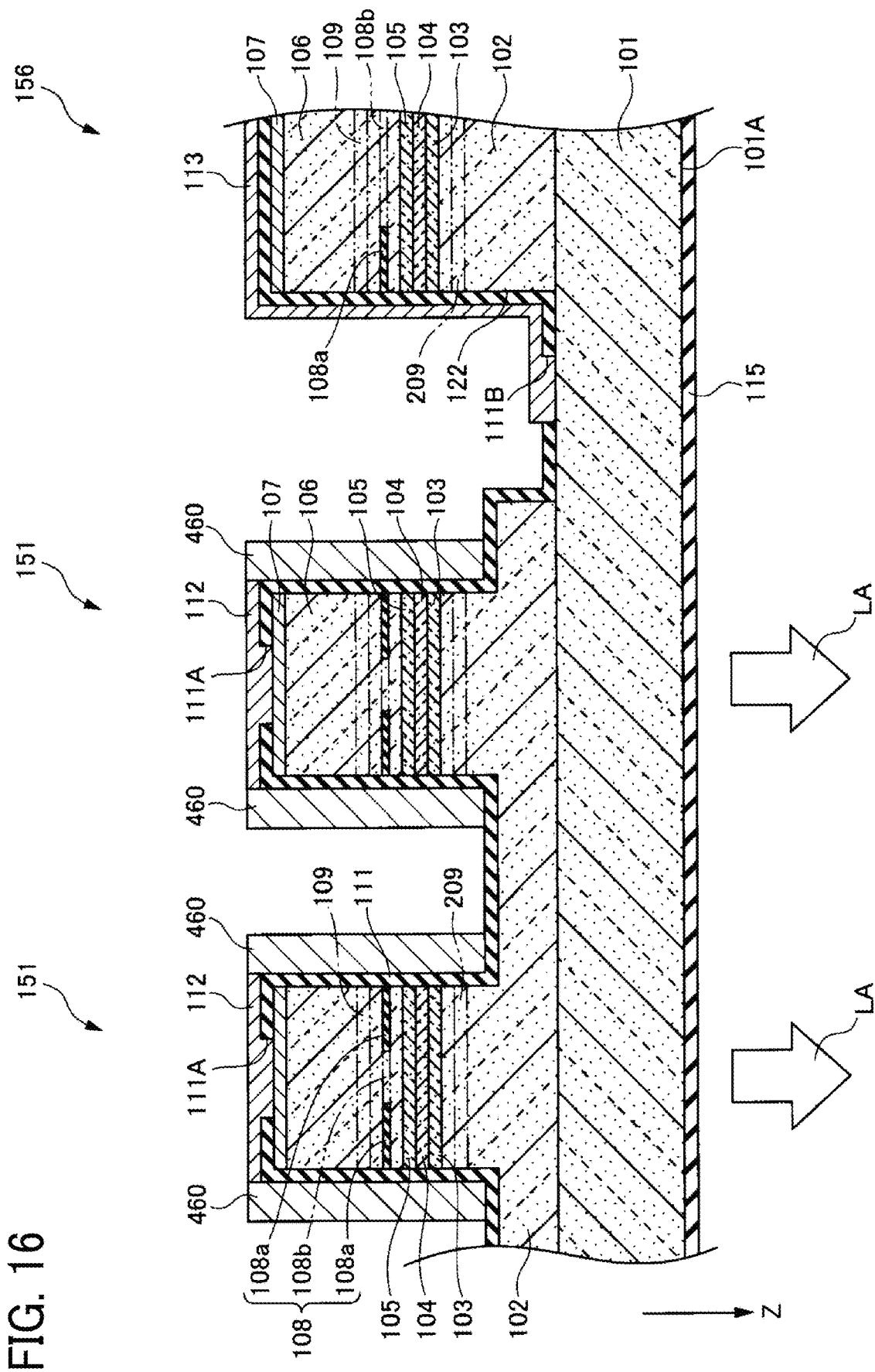
FIG. 16 is a cross-sectional view of an internal structure of the surface emitting laser in FIG. 15.
Figure 17:
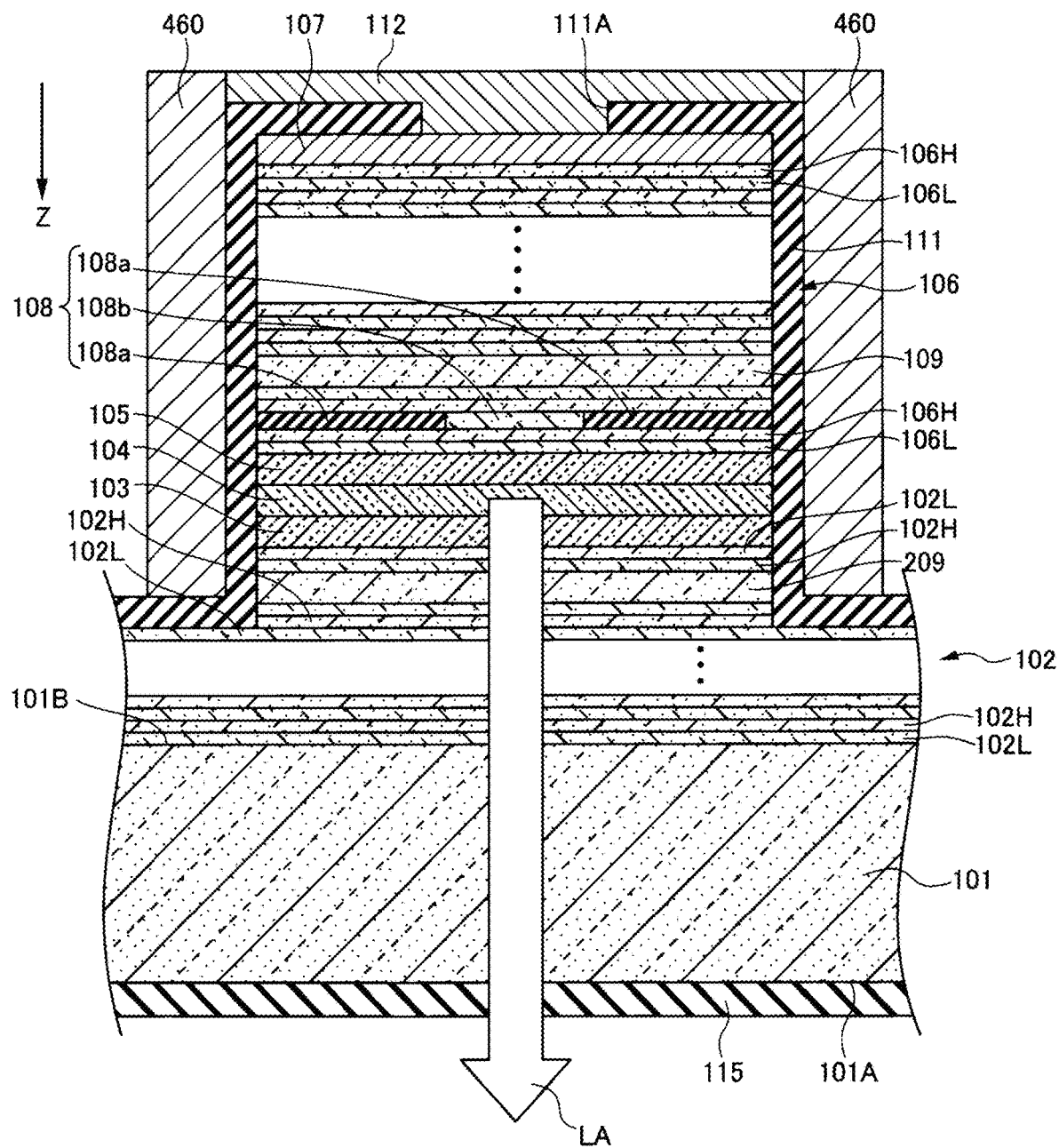
FIG. 17 is a cross-sectional view of the surface emitting laser in FIG. 15.

The following describes a fourth embodiment. The fourth embodiment differs from the third embodiment in that a metal film is provided around the mesa structure in the fourth embodiment. FIG. 15 is an illustration of a layout of a surface emitting laser according to the fourth embodiment. FIG. 16 is a cross-sectional view of an internal structure of the surface emitting laser in FIG. 15. FIG. 16 corresponds to a cross-sectional view taken along line XVI-XVI in FIG. 15. FIG. 17 is a cross-sectional view of the surface emitting laser in FIG. 15. FIG. 17 is an enlarged view of a part of FIG. 16.

In the fourth embodiment as illustrated in FIGS. 15 to 17, a metal film 460 is provided surrounding the mesa structure of each surface emitting laser element 151. The metal film 460 is in contact with the insulator film 111 and the p-side electrode 112 and covers the side surface of the mesa structure. The metal film 460 includes, for example, a gold (Au) film.

The other configurations are similar to those in the third embodiment.

The fourth embodiment also attains effects similar to those of the third embodiment. Further, the heat that has reached the substrate 101 through the high thermal-conductive layer 209 is transferred to the mount substrate such as the driver IC 300 through the metal film 460. This configuration exhibits better heat dissipation property.

The metal film 460 is formed by, for example, plating. The metal film 460 may be formed at the same time as the p-side electrode 112, or may be formed in a separate process from the p-side electrode 112. The metal film 460 may include a copper (Cu) film instead of the gold (Au) film.

When each surface emitting laser element 151 is driven at the same time, a metal film 460 may cover the side surface of the mesa structure of each surface emitting laser element 151. For example, the space between the mesa structures of the surface emitting laser elements 151 may be filled with the metal film 460.

Figure 18:
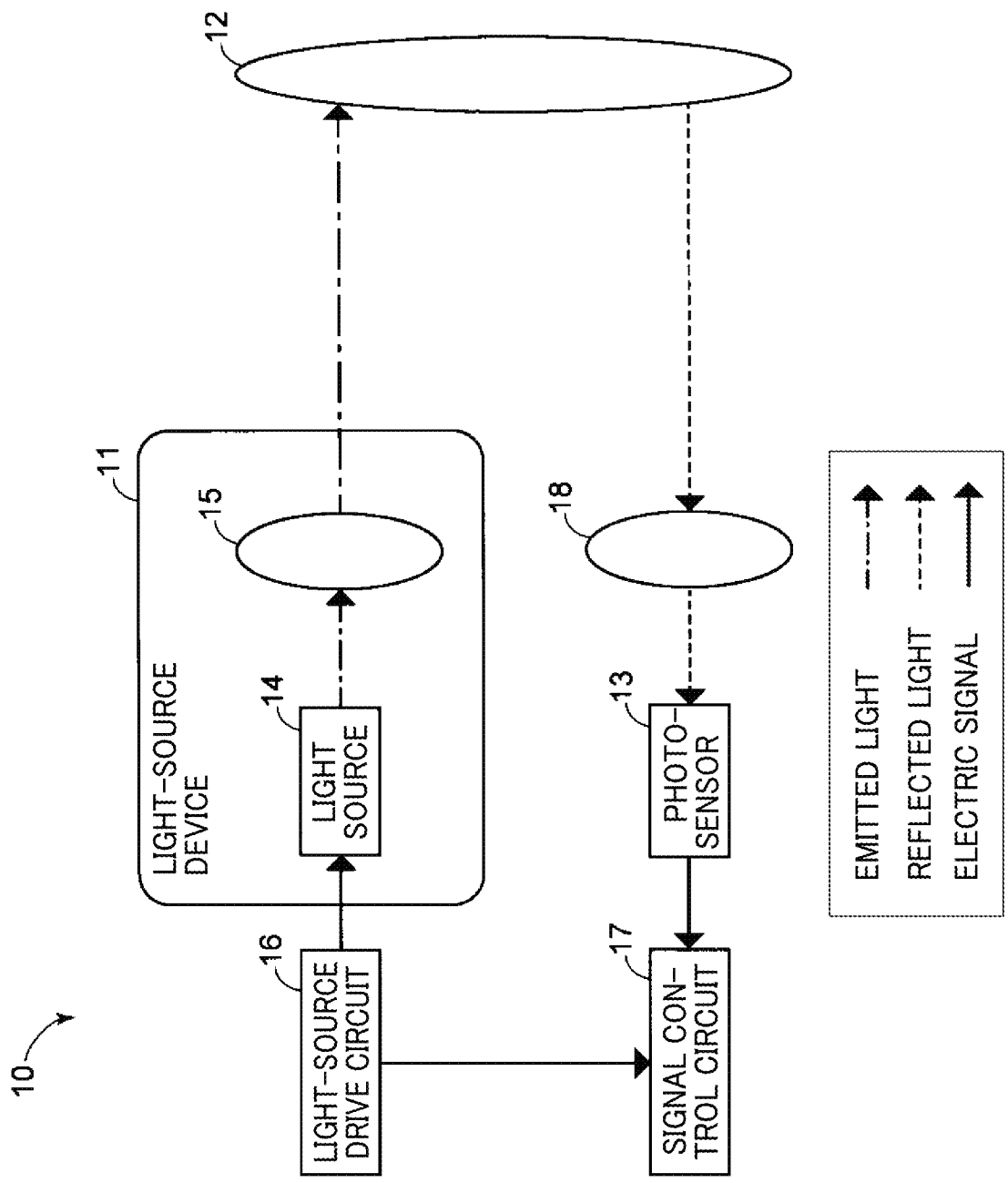
FIG. 18 is an illustration of a distance-measuring apparatus as a detection apparatus.

The following describes a fifth embodiment. The fifth embodiment relates to a light source device and a detection apparatus including the surface emitting laser 100 according to any one of the first embodiment to the fourth embodiment. FIG. 18 is an illustration of a distance-measuring apparatus 10 as a detection apparatus.

The distance measuring apparatus 10 includes a light source device 11 as an example of the light source device. The distance measuring apparatus 10 is a time-of-flight (TOF) distance detection apparatus that provides projection (irradiation) with pulsed light from the light source device 11 to an object to be detected 12, receives the reflected light from the object to be detected 12 by a photosensor 13, and measures the distance from the object to be detected 12 based on the time required for receiving the reflected light.

As illustrated in FIG. 18, the light source device 11 includes a light source 14 and an optical system 15. The light source 14 includes the surface emitting laser 100 according to the first embodiment, and the emission of light of the light source 14 is controlled based on electric current sent from a light-source drive circuit 16. The light-source drive circuit 16 transmits a signal to a signal control circuit 17 when the light source 14 is caused to emit light. The optical system 15 includes an optical element, such as a lens, a diffractive-optical element (DOE), or a prism, that adjusts the angle of divergence or direction of the light emitted from the light source 14, and irradiates the object to be detected 12 with the light.

The light that is projected from the light source device 11 and then reflected by the object to be detected 12 is guided to the photosensor 13 through a light receiving optical system 18 that has a light focusing effect. The photosensor 13 includes a photoelectric conversion element. The light that is received by the photosensor 13 is photoelectrically converted, and the photoelectrically-converted light is sent to the signal control circuit 17 as an electrical signal. The signal control circuit 17 calculates the distance to the object to be detected 12 based on the time difference between the timing of light projection (i.e., the timing at which a light emission signal is input from the light-source drive circuit 16) and the timing of light reception (i.e., the timing at which a light reception signal is input from the photosensor 13). Accordingly, in the distance measuring apparatus 10, the light receiving optical system 18 and the photosensor 13 function as a detection system on which the light emitted from the light source device 11 and reflected by the object to be detected 12 is incident. The signal control circuit 17 may be configured so as to obtain, for example, information about the presence or absence of the object to be detected 12 and the relative velocity of the object to be detected 12, based on a signal sent from the photosensor 13.

The present embodiment provides the light source device 11 and the distance measuring apparatus 10 that exhibit better heat dissipation property while increasing the light-emission intensity.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. A surface emitting laser comprising:
a first reflecting mirror;
a second reflecting mirror; and
an active region between the first reflecting mirror and the second reflecting mirror, wherein
the first reflecting mirror and the second reflecting mirror each includes:
a plurality of low refractive-index layers having a first refractive index; and
a plurality of high refractive-index layers having a second refractive index higher than the first refractive index,
the plurality of low refractive-index layers and the plurality of high refractive-index layers are alternated one after another, and
the plurality of high refractive-index layers of the first reflecting mirror includes:
a first layer; and
a second layer having a higher thermal diffusion property in an in-plane direction than the first layer.

2. The surface emitting laser according to claim 1, wherein the second layer has a higher thermal conductivity than the first layer.

3. The surface emitting laser according to claim 1, wherein the second layer is thicker than the first layer.

4. The surface emitting laser according to claim 1, wherein the second layer is a GaAs layer.

5. The surface emitting laser according to claim 1, wherein the second layer has an optical thickness of $(2n+1)\lambda/4$ where $\lambda$ is a wavelength of light emitted from the active region, and n is a natural number.

6. The surface emitting laser according to claim 1, wherein
the first layer includes one or more first layers, and
at least one set of one of the one or more first layers and one of the plurality of low refractive-index layers is between the second layer and the active region.

7. The surface emitting laser according to claim 1, wherein the surface emitting laser is configured to emit light through the second reflecting mirror.

8. The surface emitting laser according to claim 1, wherein the plurality of high refractive-index layers of the second reflecting mirror further includes:
a third layer; and
a fourth layer having a higher thermal diffusion in the in-plane direction than the third layer.

9. The surface emitting laser according to claim 1, wherein the active region, the first reflecting mirror, and the second reflecting mirror constitute a mesa structure, and
the surface emitting laser further comprises a metal film covering a side surface of the mesa structure.

10. A surface emitting laser device comprising:
a mount substrate; and
the surface emitting laser according to claim 1 on the mount substrate.

11. A light source device comprising:
the surface emitting laser device according to claim 10; and
a driver configured to drive the surface emitting laser device.

12. A detection apparatus comprising:
the light source device according to claim 11; and a photosensor configured to detect light emitted outside from the surface emitting laser and reflected by an object.

13. The surface emitting laser according to claim 1, wherein
the surface emitting laser is on a substrate,
the second reflecting mirror, the active layer, and the first reflecting mirror are arranged in order from the substrate,
the plurality of high refractive-index layers included in the first reflecting mirror further includes a third layer,
the first layer, the second layer, and the third layer are arranged in order from the active layer, and
the second layer has:
a smaller bandgap than the first layer and the third layer; and
a higher thermal diffusion property in the in-plane direction than the first layer and the third layer.

14. A light source device comprising:
the surface emitting laser device according to claim 13 on a mount substrate; and
a driver configured to drive the surface emitting laser device.

15. A detection apparatus comprising:
the light source device according to claim 14; and
a photosensor configured to detect light emitted outside from the surface emitting laser and reflected by an object.

16. The surface emitting laser according to claim 1, wherein
the first reflecting mirror is p-type, and the second reflecting mirror is n-type,
the plurality of high refractive-index layers included in the first reflecting mirror further includes a third layer,
the first layer, the second layer, and the third layer are arranged in order from the active layer, and
the second layer has:
a smaller bandgap than the first layer and the third layer; and
a higher thermal diffusion property in the in-plane direction than the first layer and the third layer.

17. A light source device comprising:
the surface emitting laser device according to claim 16 on a mount substrate; and
a driver configured to drive the surface emitting laser device.

18. A detection apparatus comprising:
the light source device according to claim 17; and
a photosensor configured to detect light 17 outside from the surface emitting laser and reflected by an object.

19. The surface emitting laser according to claim 1, wherein the second layer is a p-type semiconductor layer.

20. The surface emitting laser according to claim 1, wherein
the first reflecting mirror includes a selective oxide layer, and
the second layer is further away from the active layer than the selected oxide layer.

* * * * *